United States Patent [19]

Sasaki et al.

[11] Patent Number: 4,845,452
[45] Date of Patent: Jul. 4, 1989

[54] COMPOSITE BEAD ELEMENT

[75] Inventors: Yoshinori Sasaki, Honjo; Toshihiro Kuroshima; Sumio Takahashi, both of Yuzamachi, all of Japan

[73] Assignee: TDK Corporation, Tokyo, Japan

[21] Appl. No.: 254,324

[22] Filed: Oct. 5, 1988

[30] Foreign Application Priority Data

Oct. 8, 1987 [JP] Japan .............................. 62-153344[U]

[51] Int. Cl.⁴ .............................................. H01F 5/00
[52] U.S. Cl. .................................................. 336/200
[58] Field of Search ............ 361/302, 306 DC, 321 R, 361/400, 401; 336/200

[56] References Cited

U.S. PATENT DOCUMENTS

| 4,328,530 | 5/1982 | Bajorek et al. | 361/401 |
| 4,342,069 | 7/1982 | Link | 361/401 |
| 4,758,808 | 7/1988 | Sasaki et al. | 336/200 X |

Primary Examiner—Donald A. Griffin
Attorney, Agent, or Firm—Panitch, Schwarze, Jacobs and Nadel

[57] ABSTRACT

A composite bead element comprises a chip-like magnetic body in a shape of a nearly rectangular parellelepiped in which a recess is provided, at least one feed-through holes formed in said body and an electronic component inserted in said recess. Bead inductors are formed by conductors provided in said feed-through holes, and said electronic component and said conductors are connected by predetermined conductors on a surface of said body.

2 Claims, 4 Drawing Sheets

FIG. 5　FIG. 6　FIG. 7
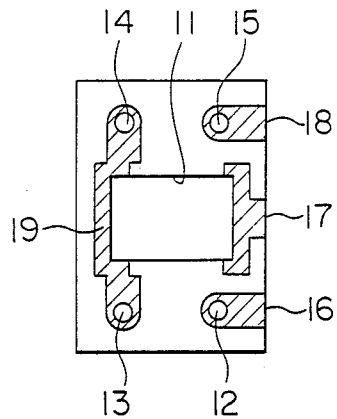
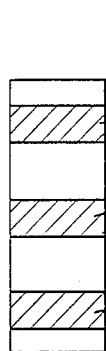
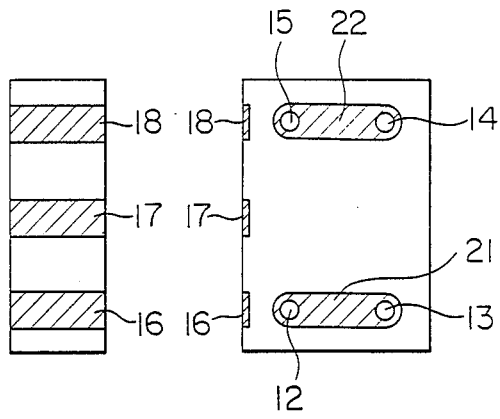
FIG. 8
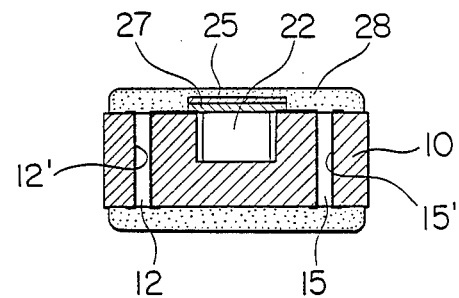

COMPOSITE BEAD ELEMENT

BACKGROUND OF THE INVENTION

1. Field of the Invention

This invention relates to a composite circuit element, and more particularly relates to a chip-type composite bead element in which, for example, a filter circuit is formed.

2. Description of the Prior Art

Pins of an integrated circuit (IC) are generally connected to external circuits through filter elements which are in the form of a bead or the like. Such filter elements will interfere with each other when they are mounted to IC pins which are closely arranged unless they are made as small as possible. Hence, in order to provide smaller pin spacings, miniaturization of filter elements is mandatory. Inductors and capacitors are necessary as minimum components of a filter element, and the requirement for miniaturization can not be achieved unless these components are made compact. For example, a filter element shown in FIG. 1 comprises four coils L1, L2, L3 and L4, and a capacitor C. The filter element formed by discrete coils and capacitor will result in a large size, hence it is necessary to provide the filter element in form of a composite chip. As one aspect of the miniaturization, the present applicant has filed a Japanese Utility Model Application on a proposal in which the regions of inductors consist of a single magnetic body (The application has not been laid open at the moment of the present application). FIGS. 2 and 3 show the outline of the proposal. That is, a plurality of feed-through holes are provided in a magnetic body 1 which is formed by a magnetic ferrite having a high magnetic permeability, and a conductor 3 is inserted through the adjacent feed-through holes successively from the opposite direction to make the surroundings of each feed-through hole an equivalent bead inductor.

In the above-described configuration, inductors are unified in a composite body to achieve miniaturization, but it is necessary to mount capacitors on a surface of the magnetic body 1. Hence, the total thickness of the filter circuit component is still large, and accordingly it is impossible to satisfactorily answer the requirement of reduction fo pin spacings due to miniaturization of IC's.

SUMMARY OF THE INVENTION

It is an object of the present invention to achieve a leadless, thin and miaturized composite electronic circuit which includes inductance, such as a filter element or the like, and more particularly to achieve a leadless, thin and miaturized composite electronic circuit which principally comprises composite bead-type inductors.

The composite bead element according to the present invention includes a magnetic body which is formed in a nearly rectangular parallelepiped, at least one electronic component (a capacitor or the like) inserted and fixed in at least one corresponding recess thereof, feed-through conductors for forming inductors which are provided in at least one feed-through hole in said magnetic body, and predetermined conductors for connection which are formed in a surface of said magnetic body.

The composite bead element of the present invention comprises a chip-like magnetic body (especially a magnetic ferrite having a high magnetic permeability) which has a shape of a nearly rectangular parallelepiped, and which comprises at least one recess provided on one surface thereof and at least one feed-through hole extending from said one surface to the opposite surface, an electronic component which comprises a planar upper surface and film-like external terminals on both end portions of said upper surface, and which is inserted in each said recess so that said upper surface coincides with said one surface, conductors for forming beads inductors which are provided in said feedthrough holes, an interconnection network which includes extension conductors of the conductors for foming bead inductors and film-like connection conductors provided on edge portions of said recess such that they align with said external terminals in said recess, conductive pieces for bridging across said external terminals of said electronic component and said connection conductors, and solders for connecting said conductive pieces to said external terminals and said connection conductors.

According to the present invention, an electronic component is buried in a recess formed on a surface of a magnetic body, so that the total thickness of a composite bead element becomes sufficiently small and thin. Moreover, by using conductive pieces, soldering connection which is always reliable becomes possible, and this results in a drastic reduction in generation of rejects.

BRIEF DESCRIPTION OF THE DRAWINGS

FIG. 5 is a plan view of a magnetic body and conductors thereon;

FIG. 6 is an end view of the same;

FIG. 7 is a bottom plan view of the same;

FIG. 8 is a cross-sectional view of a completed product taken on line B—B in FIG. 4.

DETAILED DESCRIPTION OF THE INVENTION

The composite bead element of the present invention comprises a magnetic body which is the basic material of the element, feed-through holes which are formed in the magnetic body and feed-through conductors formed therein in order to form a composite bead inductor, an electronic component which is mounted to the magnetic body, such as a capacitor or the like, and conductors for connection formed on a surface of the magnetic body in order to form a predetermined circuit.

The magnetic body is made from a sintered body of an arbitrary magnetic oxide which is known as a high magnetic-permeability ferrite. At least one recess for receiving an electronic component and feed-through holes are simultaneously produced in the powder forming process before firing the magnetic body.

On the other hand, the conductors can be produced by using conductive wires or a conductive paste. As the conductive paste, a paste consisting of a fine powder of silver, silver-palladium, copper, nickel or the like and a frit (a glass powder) can be used.

As the conductive pieces for bridging across the external terminals of the electronic component and the connection conductors formed on edge portions of the recess, tin alloys, silver alloys, or other metals or alloys known in this technical field which have solderability can be used.

When an electronic component is inserted and held in a recess of a supporting substrate, such as a printed circuit board or the like as described above, minute gaps are inevitably produced between walls of the recess and end surfaces of the electronic components. Surface tension acts on a solder, so that when such a gap exists between two conductive regions to be connected to one another, a fused solder tends to form two balls as a result of being drawn to each region. This results in unreliable solder connection, and the generation rate of rejects becomes extremely high. Accordingly, it is necessary to work very precisely the dimensions of the electronic component and the recess. It is difficult, however, to provide accuracy in the present invention wherein a sintered body is used which easily produces distortion due to firing, such as a ferrite, and polishing process or the like for in order to provide accuracy will result in a higher production cost. According to the present invention, it has become possible to avoid this problem by performing solder connection by utilizing auxiliary conductive pieces even without increasing working accuracy.

Now, an embodiment of the invention will be explained in detail hereafter, but the production method will not be explained at all with the assumption that the above-described method, for example, is adopted.

EXAMPLE

Figure 4:
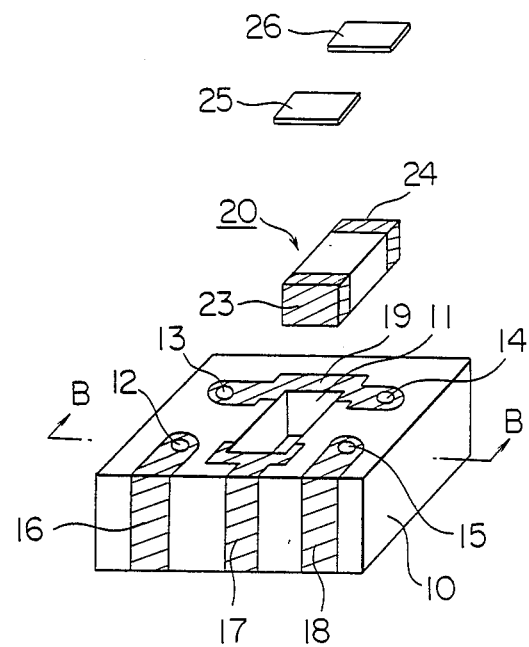
FIG. 4 is an exploded perspective view of an intermediate product of a composite bead element of the present invention.

An explanation will be made by reference to FIGS. 4 through 8. FIG. 4 is an exploded perspective view of a composite bead element of the present invention, and FIGS. 5 through 7 are diagrams showing a magnetic body and conductors. FIG. 8 is a cross-sectional view of a completed composite bead component by performing soldering and resin packaging.

Figure 1:
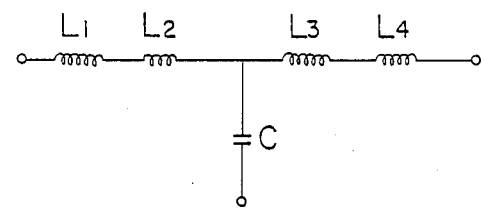
FIG. 1 is a circuit diagram of a filter circuit.
Figure 2:
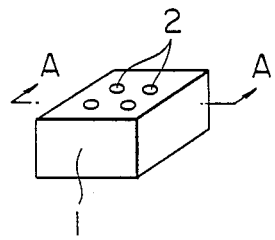
FIG. 2 is a perspective view of a composite beads inductor.
Figure 3:
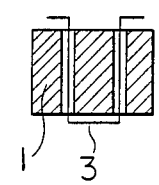
FIG. 3 is a cross-sectional view taken on line A—A in FIG. 2.

The composite bead element of the present invention includes a magnetic body 10 and an electronic component 20 which is to be fixed thereto. The electronic component is, for example, a capacitor, with which a circuit as shown in FIG. 1 can be constituted, or it may be any other element, such as L, C, R, or a composite component consisting of these elements.

The magnetic body 10 has a form of a rectangular parallelepiped, and includes a recess 11 which has dimensions for receiving the electronic component 20 on an upper surface thereof, and feed-through holes 12, 13, 14 and 15 which are pierced through from the upper surface to the lower surface. In the holes 12, 13, 14 and 15, conductors 12', 13', 14' and 15' ( conductors 13' and 14' are for holes 13 and 14, respectively, which are not illustrated ) are formed as shown in FIG. 8. Also as shown in FIGS. 4 through 7, terminal electrodes 16, 17 and 18 extend from the conductor 12' in the hole 12, from an end portion of the recess 11 and from the conductor 15' in the hole 15, respectively, extend downwardly along a side surface of the magnetic body, and further extend slightly to the lower surface of the magnetic body. These electrodes become terminals used for conductive connection to external circuits. Further, a conductor 19 connects between the conductors 14' and 15' in the holes 14 and 15, and passes along other end portion of the recess at the intermediate portion thereof.

On the base surface of the magnetic body, a conductor 21 which connects between the conductors 13' and 14' of the holes 13 and 14, and a conductor 22 which connects between the conductors 15' and 16' in the holes 15 and 16 are formed as shown in FIG. 7.

In the recess 11 of the magnetic body on which electrodes and conductors are disposed as described above, the electronic component 20 which has terminals 23 and 24 on both ends thereof is inserted. Since the depth of the recess 11 is formed so as to be nearly equal to the height of the electronic component 20, a nearly flat upper surface as a whole is formed. Soldering connection between the terminals 23, and 24 of the electronic component and the terminal electrode 17, and the conductor 19 can be reliably performed by using auxiliary conductive pieces 25 and 26 which have solder 27 on the lower surfaces thereof ( see FIG. 8 ).

The structure which has been constituted as described above is finally protected by a resin coating or package 28, such as an epoxy resin ( FIG. 8 ). On this occasion, the side surface region of the terminal electrodes 16, 17 and 18 is left exposed without being coated by the resin. At the moment of application, these terminal electrodes 16, 17 and 18 are connected to interconnections on a printed circuit board in such a way that they are faced down or the terminal electrode 17 becomes a side surface. The completed composite beads element comprises four inductor regions and a capacitor ( generally an electronic component ). A circuit which includes inductors extends first from the terminal electrode 16 on the front surface of the magnetic body via the conductor 12' in the feed-through hole 12 to the back surface, then extends by the feed-through hole 21 to the conductor 13' in the feed-through hole 13, extends therefrom by the conductor 13' to the front surface of the magnetic body. Then, it extends by the conductor 19 via an end portion of the electronic component 20 to the feed-through hole 14, extends again through the conductor 14' in the feed-through hole 14 to the back surface of the magnetic body, then extends by the conductor 22 to the feed-through hole 14, further extends by the conductor 14' to the front surface of the magnetic body, and finally reaches the terminal electrode 18.

Figure 9:
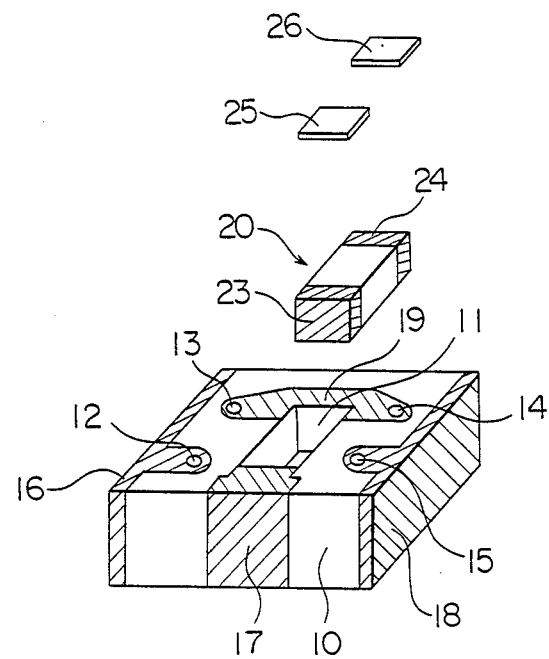
FIG. 9 is a perspective view showing a modified embodiment of the present invention.

In the embodiment shown in FIGS. 4 through 8, the terminal electrodes may not necessarily be on the same side surface region. For example, the terminal electrodes 16, 17 and 18 may be on different surfaces, respectively, as shown in FIG. 9. In FIG. 9, the terminal electrode 17 is on the same side surface as in the above example, and the external electrodes 16 and 18 cover the total surface of the side surface regions which are at left and right of the surface for the terminal electrode 17. It will be noted that other configurations are the same as those explained in FIGS. 4 through 8.

FUNCTION AND ADVANTAGES

There exists a magnetic substance around the feed-through hole 12, 13, 14 and 15, respectively, so an inductor is formed, respectively, and there results in a composite bead inductor in which these inductors are connected in series. Since the conductors 12', 13', 14' and 15' pass through the feed-through holes 12, 13, 14 and 15 in reverse directions in sequential order, magnetic fluxes which pass through the magnetic body 10 act without extinguishing each other, and thus an inductance can be obtained. Further, the capacitor 20 which is inserted in the recess 11 is located at an intermediate position among the four inductors in parallel. Accordingly, the circuit shown in FIG. 1 can right be constituted. In the present invention, moreover, the height of the capacitor 20 becomes low because it is fitted in the recess 11, so the total height of the composite beads element becomes low. This has an advantage that less space is required when the element is mounted to IC pins or the like. Moreover, by using conductive pieces, soldering connection which is always reliable becomes possible, and this results in a drastic reduction in generation of rejects.

What is claimed is:

1. A composite bead element comprising:
   a chip-like magnetic body which has a shape of a nearly rectangular parallelepiped and has at least one recess on one surface;
   an electronic component mounted in each said recess;
   at least one feed-through hole formed in said body;
   conductors provided in said feed-through holes for forming bead inductors by said conductors and the magnetic body therearound; and
   said electronic component and said conductors are connected by predetermined conductors on a surface of said body.

2. A composite bead element comprising:
   a chip-like magnetic body which has a shape of a nearly rectangular parallelepiped, and which comprises at least one recess provided on one surface thereof and at least one feed-through hole extending from said one surface to the opposite surface;
   an electronic component which comprises a planar upper surface and film-like external terminals on both end portions of said upper surface, and which is inserted in each said recess so that said upper surface coincides with said one surface;
   conductors for forming bead inductors which are provided in said feed-through holes;
   an interconnection network which includes extension conductors of the conductors for forming bead inductors and film-like connection conductors provided on edge portions of said recess such that they align with said external terminals in said recess;
   conductive pieces for bridging across said external terminals of said electronic component and said connection conductors; and
   solders for connecting said conductive pieces to said external terminals and said connection conductors.

* * * * *